United States Patent [19]
Fritz et al.

[11] Patent Number: 5,117,085
[45] Date of Patent: May 26, 1992

[54] CATHODE HOLDER FOR AN ELECTRON BEAM GENERATOR

[75] Inventors: Dieter Fritz, Gelnhausen; Helmut Spruck, Gilching, both of Fed. Rep. of Germany

[73] Assignee: PTR Praezisionstechnik GmbH, Maintal/Doernigheim, Fed. Rep. of Germany

[21] Appl. No.: 579,788

[22] Filed: Sep. 10, 1990

[30] Foreign Application Priority Data

Sep. 9, 1989 [DE] Fed. Rep. of Germany ....... 3930203

[51] Int. Cl.⁵ .............................................. B23K 15/00
[52] U.S. Cl. ............................ 219/121.27; 219/121.34; 373/13
[58] Field of Search ................ 219/121.27, 121.34; 373/13

[56] References Cited

U.S. PATENT DOCUMENTS

| | | |
|---|---|---|
| 3,187,216 | 6/1965 | Sciaky ................ 219/121.13 X |
| 3,274,425 | 9/1966 | Sciaky ................ 219/121.13 X |
| 4,998,004 | 3/1991 | Lawrence et al. ........... 219/121.13 |

*Primary Examiner*—C. L. Albritton
*Attorney, Agent, or Firm*—Felfe & Lynch

[57] ABSTRACT

The cathode holder 4 has two terminals 8, 9 which are rigidly connected to one another and together form a flange 20 which by means of a pressure bearing with spheres 27, 28 made of a ceramic material is supported in a carrier flange 3 connected to the control electrode 5. The spheres 27, 28 rest in rolling paths aligned in radial direction to the optical axis 14 and provide a centering of the cathode 7 with respect to the control electrode 6 which is independent of expansions.

11 Claims, 2 Drawing Sheets

CATHODE HOLDER FOR AN ELECTRON BEAM GENERATOR

BACKGROUND OF THE INVENTION

The invention relates to a cathode holder for an electron beam generator, in particular for an electron beam gun, comprising two terminals disposed in a carrier where they are insulated and separated by an insulator.

In order to maintain the centered position and the optimum focussing of the electron beam in electron beam generators, it is necessary that the emission surface of the hot cathode is placed exactly in the center of the control cathode and remains in this position during operation with a high degree of accuracy. Whereas the hot cathode, with respect to its spatial form, exhibits sufficient thermal stability to ensure the necessary centering, the transformations in the form of the cathode holder which are caused by the gradual heating often lead to an eccentric displacement of the cathode emission surface calling for a readjustment of the electron beam.

SUMMARY OF THE INVENTION

It is an object of the invention to provide an electron beam generator which ensures an exact centering of the cathode emission surface in all operating conditions.

This object is achieved in that both terminals of the cathode holder are symmetrically and movably supported on rolling or gliding bodies in a plane that is perpendicular to the optical axis of the electron beam generator. These bodies are guided in rolling or gliding paths which run about the optical axis at constant radius.

The two terminals when heated up symmetrically expand with respect to the optical axis so that the emission surface of the hot cathode maintains its center position. The cathode holder in accordance with the invention hence ensures an exact centering of the cathode during the heating cycle at all temperature conditions. Temperature-induced changes of the position of the electron beam are hence avoided.

The rolling or gliding bodies can be made of a temperature-resistant material, preferably a ceramic material. It is thus possible to reduce the structural complexity and the manufacturing cost for the insulation of the terminals. Preferably, these rolling or gliding bodies are optically shielded with respect to the electron beam so as to prevent metal vapors from depositing.

The invention further proposes that one half of each of the two terminals which are joined by a connecting element to form a structural unit form an annular flange located in a plane perpendicular to the optical axis. This flange contains grooves which form radial gliding paths. Further, it is possible that the terminals are supported in an annular carrier flange which has grooves with radial rolling paths opposite the grooves in the flange.

In order to avoid play in the roller or slide bearing, the invention further proposes that pre-bent springs press the terminals against the rolling or gliding bodies. The springs, too can be supported on the terminals via rolling or gliding bodies which are guided in rolling or gliding paths. The advantage thereof is that the transmission of the resilient force does not lead to jamming forces which impede the symmetric expansion of the terminals. According to another proposal of the invention, the individual springs can advantageously be configured as individual spring tongues which are disposed at a common ring which can be connected to the carrier flange.

Yet another proposal of the inventions determines that an exact alignment of the two terminals to one another and a simple mutual insulation of the terminals ia achieved in that the terminals on both sides of a plane located in the optical axis are supported against each other by three spheres made of a temperature-resistant insulating material. These spheres rest in funnel-like indentations in the front surface of the terminals which face one another and an insulated connecting screw presses the terminals against the spheres press.

DETAILED DESCRIPTION OF THE PREFERRED EMBODIMENTS

Figure 1:
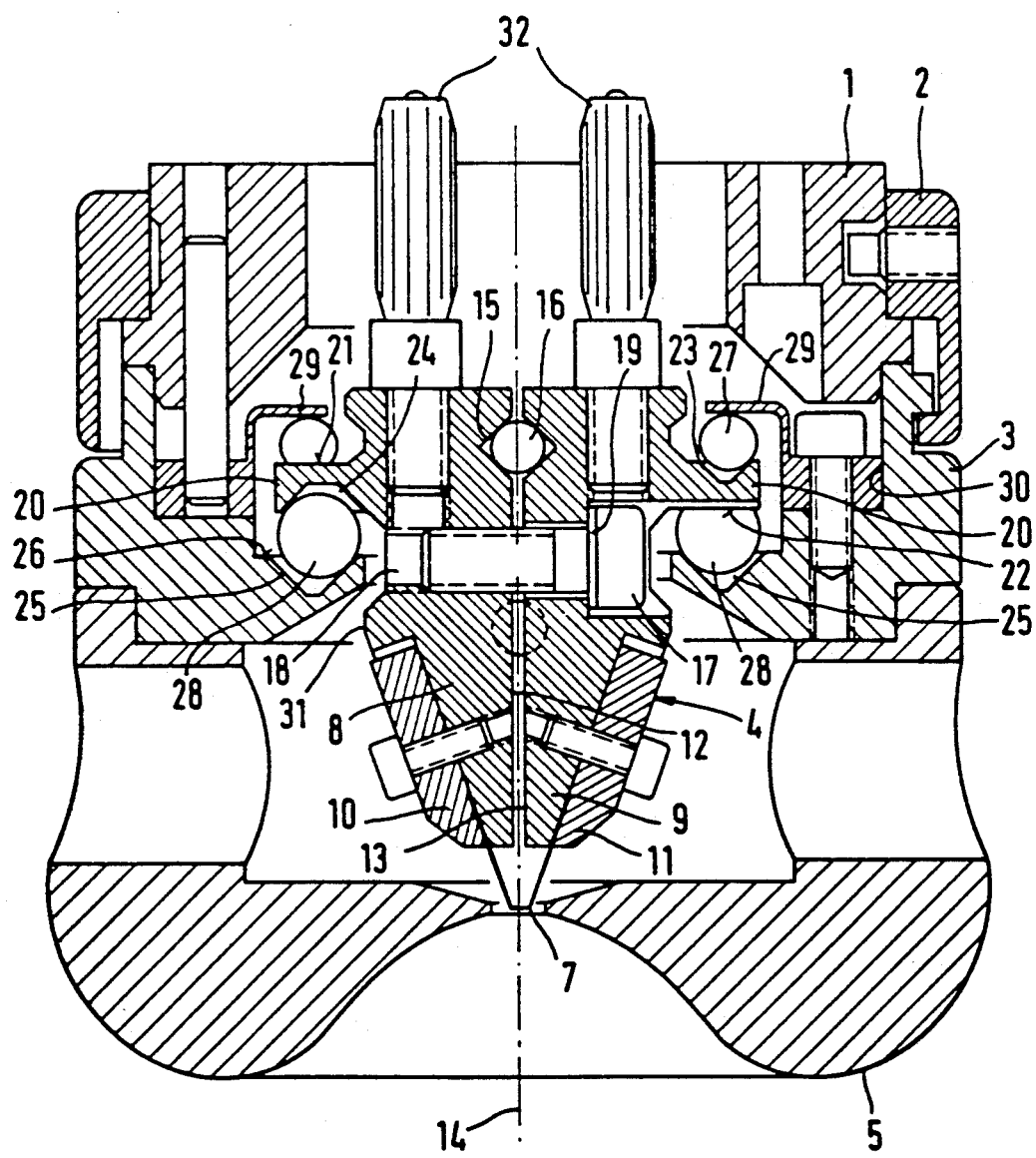
FIG. 1 is a cross section of the beam generator of an electron gun including the cathode holder of the invention and FIG. 2 is a top view of the cathode holder of FIG. 1 removed from the beam generator together with the support ring.
Figure 2:
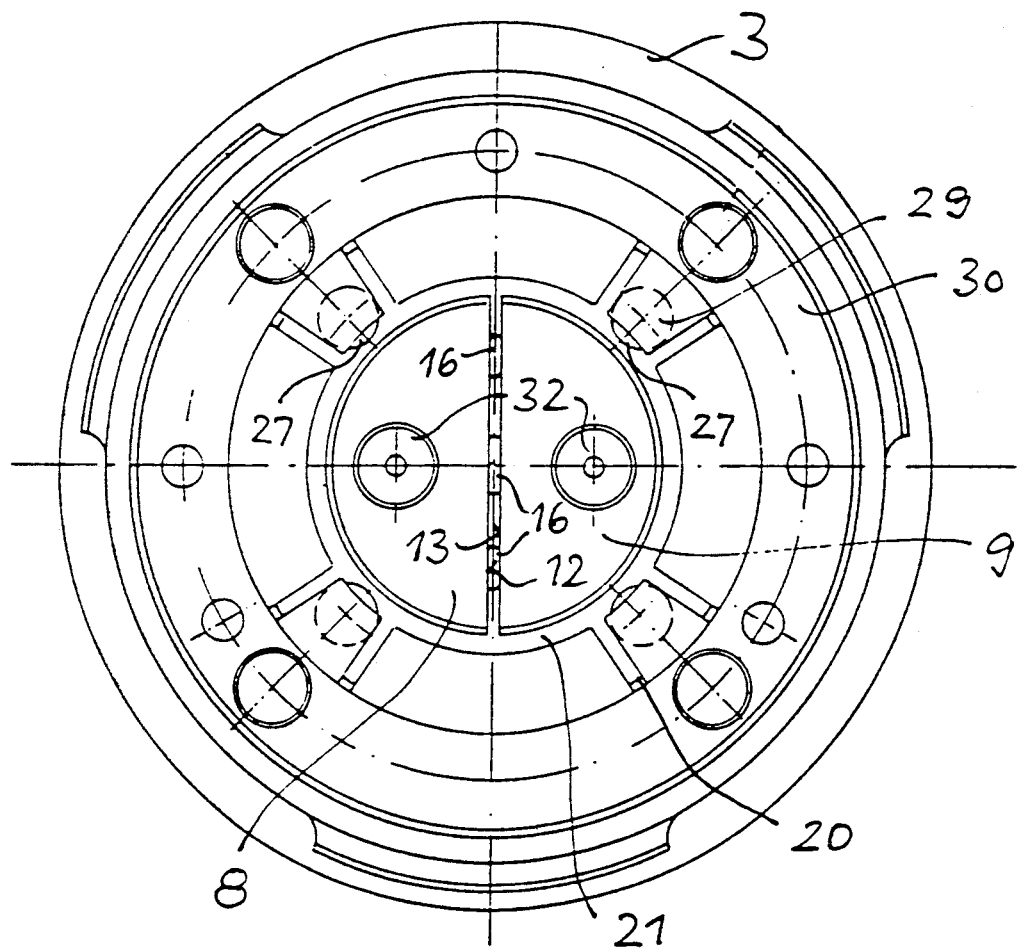

FIG. 1 shows the beam generator of an electron gun disposed on the bottom end of a high-voltage insulator. The components of the beam generator are supported by a mounting flange 1 which is connected to the non-represented high-voltage insulator and has a bayonet ring 2. The latter serves to separably attach an annular carrier flange 3 to the mounting flange The cathode holder 4 is supported in this annular carrier flange 3. Aligned via centering surfaces, a beam forming control electrode 5 is attached to the bottom of the carrier flange 3 and with its center opening, this electrode 5 surrounds the lower end of hot cathode 7 disposed at the cathode holder 4. The cathode holder comprises two essentially mirror-symmetric terminals 8, 9 provided with clamping shoes 10, 11 at their lower ends in order to attach the two ends of the hot cathode 7. The two terminals 8, 9 face flat surface 12, 13 essentially aligned with one another in a parallel manner, these surfaces being on both sides of the optical axis 14 of the beam generator. In the surfaces there are three opposing, funnel-like indentations 15 in which there are disposed three respective spheres of a ceramic insulating material which maintain an insulating space between the surfaces 12, 13. At the same time the three spheres serve to provide an exactly defined alignment of the two terminals 8, 9 to each other. In the center of the triangle described by the spheres 16, there is a connecting screw 17 screwed into a threaded bore 18 in the connector terminal 8. The head of this screw is supported via a insulating disk 19 on the connector terminal 9. The connecting screw 17 connects the two terminals 8, 9 and with its funnel like indentations, it presses the terminals against the spheres 16. The two terminals 8, 9 are thus joined to form a rigid component but still are electrically insulated from each other.

Rotational-symmetrical covering surfaces, the center of which lies on the optical axis 14, are contiguous to the surfaces 12, 13 of the terminals 8, 9. With these surfaces each terminal 8, 9 forms a half of an annular flange 20 by means of which the cathode carrier 4 is supported in the carrier flange 3. For this purpose, the flange 20 has a pair of grooves 23, 24, in both of each circular side wall 21, 22, these grooves forming gliding paths of a short length which run in azimuthal direction (angularly at constant radius) to the center formed by the optical axis 14. The grooves 23 in the sidewall 21 are angularly shifted with respect to the grooves 24 in the opposite sidewall 22. The grooves 24 in the sidewalls 22 are located opposite grooves 25 in a circular surface 26 of the flange ring 3. They also form gliding paths about the center of the optical axis 14 at constant radius. Spheres 27 are disposed in grooves 23 and spheres 28 are disposed in the grooves 24, 25. The spheres 27, 28 are made of a ceramic insulating material and insulate the cathode holder 4 with respect to the modulating [Wehnelt]voltage at the carrier flange 3. Spring tongues 29 which are under pretension rest on the spheres 27 and fixed to a ring 30 which is in threaded connection with the carrier ring 3, this ring surrounding the flange 20 at a distance. The bearing thus formed by the spheres 27, 28 is braced and held together in axial direction. On the side facing the hot cathode, the opening in the carrier flange 3 is optically shielded by a collar 31 formed by the covering surfaces of the terminals 8, 9. The purpose thereof this is to prevent depositions on the spheres 27, 28.

Due to the described bearing, the cathode holder 4 formed by the two terminals 8, 9 is centered in the carrier flange 3. It can thus expand independent of the carrier flange 3 during heating without affecting the centering. This is a prerequisite for the constant cathode spot on the workpiece. At the same time, the described bearing provides in a simple way the necessary insulation of the cathode holder 4 with respect to the control electrode 3. The support of the two terminals 8, 9 via sphere 16, also provides a simple insulation and an exact positioning of the two halves of flange 20 with respect to one another so as to insure an exact centering of the cathode holder 4. A high degree of accuracy of the parts can, for example, be achieved in that the flange 20 and the grooves 23, 24 formed in the sidewalls 21, 22 thereof are machined in a clamped connection after the two terminals 8, 9 have been connected via the spheres 16 and the connecting screw 17.

From their sides facing away from the hot cathode 7, the terminals 8, 9 have multiple-spring wire plugs 32 by means of which they are connected to the circuit of the heating current of the electron gun.

We claim:

1. A cathode holder for an electron beam generator comprising
a carrier,
two terminals which are joined to form a structural unit, which are insulated from each other, and which carry a hot cathode, said terminals and said cathode defining an optical axis of said generator, said terminals being mounted for rotation in said carrier by guide means comprising a pair of rolling or gliding bodies symmetrically and movable disposed in a plane perpendicular to said optical axis.

2. A cathode holder as in claim 1 wherein said carrier has groove means which define rolling paths at constant radius from said optical axis, said rolling or gliding bodies being received in said groove means.

3. A cathode holder as in claim 2 wherein said structural unit has a flange with groove means therein which also define rolling paths at constant radius from said axis and which face said groove means in said carrier and likewise receive said rolling or gliding bodies.

4. A cathode holder as in claim 3 wherein said structural unit is axially movable relative to said carrier, said holder further comprising spring means which spring loads said structural unit toward carrier to retain said rolling or gliding bodies in said groove means.

5. A cathode holder as in claim 4 wherein at least one of said groove means in said carrier and said groove means in said flange on said structural unit has a substantially V-shaped cross section, whereby thermal expansion of said terminals is accommodated by said rolling or gliding bodies being offset from the center of said at least one groove means.

6. A cathode holder as in claim 4 wherein said flange on said structural unit has further groove means which also define rolling paths at constant radius from said optical axis and which face away from said groove means in said carrier, said holder comprising a further pair of rolling or gliding bodies symmetrically and movably disposed in a plane perpendicular to said optical axis in said further groove means.

7. A cathode holder as in claim 6 wherein said spring means comprises leaf springs fixed to said carrier and which bear against said further rolling or gliding bodies.

8. A cathode holder as in claim 1 wherein said rolling or gliding bodies are made of electrically insulating and heat resistant material.

9. A cathode holder as in claim 1 further comprising shielding means which optically shield said rolling or gliding bodies from the electron beam produced at said hot cathode.

10. A cathode holder as in claim 1 wherein said two terminals each have a planar face with three funnel-like indentations therein in a triangular arrangement directly opposed from like indentations in the planar face of the other terminal, said holder further comprising three electrically insulating temperature resistant spheres centered in respective indentations of each face and means for joining said terminals to form said structural unit.

11. A cathode holder for an electron beam gun comprising a cathode holder having two terminals which are joined to form a structural unit, which are insulated from each other, and which carry a hot cathode, said terminals and said cathode forming an optical axis of said generator, said terminals each having a planar face with three funnel-like indentations therein in a triangular arrangement directly opposed from like indentations in the planar face of the other terminal, said holder further comprising three electrically insulating temperature resistant spheres centered in respective indentations of each face and means for joining said terminals to form said structural unit.

* * * * *